United States Patent [19]

Strauss

[11] Patent Number: 4,806,999
[45] Date of Patent: Feb. 21, 1989

[54] AREA EFFICIENT INPUT PROTECTION

[75] Inventor: Mark S. Strauss, Allentown, Pa.

[73] Assignee: American Telephone and Telegraph Company, AT&T Bell Laboratories, Murray Hill, N.J.

[21] Appl. No.: 96,290

[22] Filed: Sep. 14, 1987

Related U.S. Application Data

[63] Continuation of Ser. No. 782,014, Sep. 30, 1985, abandoned.

[51] Int. Cl.4 ............................................. H01L 29/78
[52] U.S. Cl. .................................. 357/23.13; 357/13; 357/42
[58] Field of Search .................. 357/13, 13 PT, 13 U, 357/23.13, 41, 42; 361/56

[56] References Cited

U.S. PATENT DOCUMENTS 3,673,427 6/1972 McCoy et al. .
3,676,742 7/1972 Russell et al. ...................... 317/33 R
4,509,067 4/1985 Minami et al. ......................... 357/13
4,605,980 8/1986 Hartranft et al. ............. 357/23.13 X

FOREIGN PATENT DOCUMENTS 52-63075 5/1977 Japan ...................................... 357/42
56-50882 10/1982 Japan ................................. 357/23.13

OTHER PUBLICATIONS

The Effects of Electrostatic Discharge on Microelectronic Devices-A Review, William D. Greason and G. S. Peter Castle.
Phillips Electronic Components and Materials Division, Phillips Application Book, MOS Integrated Circuits and Their Applications, 1970 (Eindhoven, NL), pp. 107-110, see FIG. 101; p. 107, chapter: "Avalance Bulk Breakdown Device".
Patent Abstracts of Japan, vol. 8, No. 49 (E-230) (1486), Mar. 6, 1984 & JP, A, 58202573 (FUJITSU), Nov. 25, 1983, see abstract; FIG. 3.

Primary Examiner—Andrew J. James
Assistant Examiner—Sara W. Crane
Attorney, Agent, or Firm—James H. Fox

[57] ABSTRACT

An integrated circuit has an input pad protected from electrostatic discharge by two diodes located under the periphery of the pad. One of the diodes is typically formed in a n-tub, and the other in a p-tub. The boundary between the tubs is located in a region not overlaid by the exposed portion of the pad in one embodiment. An input resistor is optionally included between the pad and the input circuitry for additional ESD protection.

16 Claims, 3 Drawing Sheets

AREA EFFICIENT INPUT PROTECTION

This application is a continuation of application Ser. No. 782,014, filed Sept. 30, 1985.

BACKGROUND OF THE INVENTION

1. Field of the Invention

The present invention relates to a technique for protecting an integrated circuit from electrostatic discharge.

2. Description of the Prior Art

The protection of integrated circuits from electrostatic discharge (ESD) has become a significant aspect of IC design. The vulnerable points usually include the input terminals, through which an electrostatic discharge event can damage transistors or other circuit components. The advent of insulated gate field effect transistor (IGFET) circuitry has increased the problem, due to their very high impedance input circuits, which do not readily allow an electrostatic charge to dissipate, except by breaking down the gate insulator. Various techniques have been developed to deal with the ESD problem; see, for example, "The Effects of Electrostatic Discharge on Microelectronic Devices - A Review", *IEEE Transactions on Industry Applications*, Vol. 1A-20, W. D. Greason et al, pages 247–252 (1984).

One ESD protection technique utilized with complementary metal oxide silicon (CMOS) integrated circuits uses two diodes connected to an IC input pad, usually through a resistor. One of the diodes is connected to the positive power supply (VCC or VDD) terminal, and the other diode is connected to the ground (VSS) power supply terminal. During normal operation, when the power supply voltages are present, the diodes do not conduct. However, when a voltage in excess of a p-n junction voltage drop (about 0.7 volts) appears, conduction occurs through the diode forward biased thereby, which protects the IC circuitry. The protection is obtained even if the IC is not connected to the power supply, due to direct or capacitive coupling from each power supply terminal to the substrate of the integrated circuit.

In a typical prior art CMOS integrated circuit diode protection configuration as shown in FIG. 1, the pad (10) is connected by a conductor (not shown) to the circuit input. It is also connected via contact windows (13, 14) through an insulating layer (not shown) to n and p regions (11, 12) that form diodes with the underlying semiconductor regions of opposite conductivity (not shown), which are connected to the power supplies (VCC, VSS). Each diode is partially surrounded by a guardring (15, 16) of semiconductor material having opposite conductivity as the associated top diode regions (11, 12). The guardrings are connected to the power supplies via contact windows (17, 18) through an overlying insulator. The guardrings serve to prevent minority carriers from being injected into the substrate when a diode conducts, thereby helping to avoid latchup. The protection diodes and guardrings are spaced apart from the input pads in prior art designs, which takes up considerable IC area, as shown in FIG. 1.

It is also known to use a field effect transistor as the protection element; see FIG. 2. In that technique, the bondpad (20) and gate (22) are connected together, and to the drain (21) through contact windows (24). The source (23) is then connected to the more negative power supply voltage (VSS). In another prior art technique used with bipolar IC designs, it is known to clamp excessive input voltage signals (not of ESD origin) by placing an input "beam lead" conductor over a diode, thereby conserving space. The conductor was typically formed by electroplating gold, and then extended off of the chip for connection to external circuitry. Furthermore, in the bipolar case a single diode was typically sufficient, since the input bipolar transistor itself provided protection for the opposite polarity voltage, due to its base-emitter junction.

SUMMARY OF THE INVENTION

I have invented an input protection technique suitable for use with complementary insulated gate field effect transistor (e.g., CMOS) integrated circuits. In this technique, an input conductor pad overlies portions of both an n-type semiconductor region and a p-type semiconductor region, and is separated therefrom by a dielectric. The periphery of the conductor pad is connected through the dielectric to diodes formed in the regions. The n-type region is connected to a positive power supply terminal (e.g., VCC or VDD), whereas the p-type region is connected to a negative power supply terminal (e.g., VSS).

DETAILED DESCRIPTION

The following detailed description relates to an integrated circuit input protection technique. In the present technique, an input conductor pad, usually referred to as a "bondpad" in the art, contacts two diodes (D1, D2) around its periphery. The conductor pad contacts the p-type region of one of the diodes (D1), with the n-type diode region located thereunder. The n-type region electrically contacts a terminal adapted to providing a positive (e.g., VCC or VDD) power supply voltage to the integrated circuit. The conductor pad contacts the n-type region of the other diode (D2) with the p-type region located thereunder. The p-type region of this other diode electrically contacts a terminal adapted to providing a relatively more negative (e.g., VSS) power supply voltage.

Figure 1:
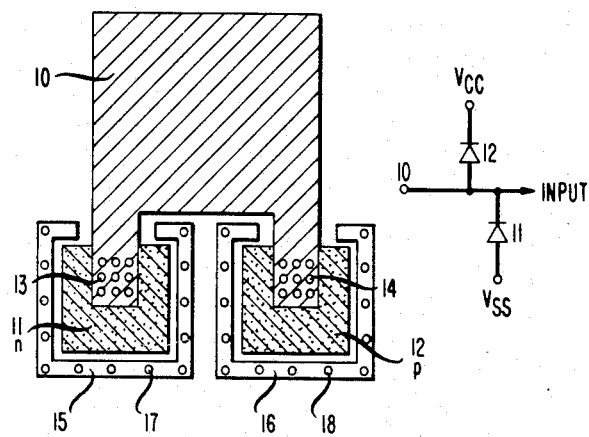
FIG. 1 illustrates a typical prior art diode protection scheme.
Figure 2:
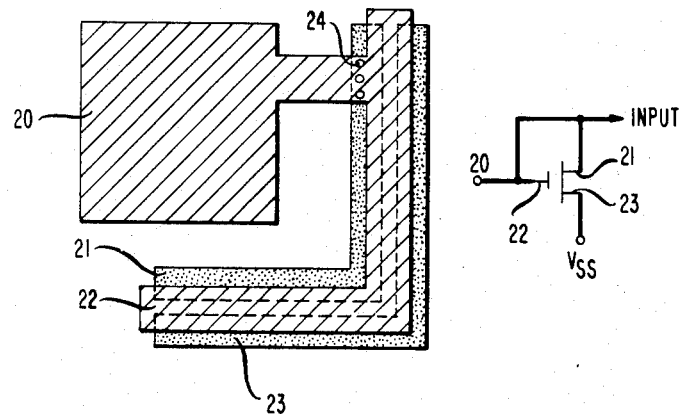
FIG. 2 illustrates a prior art field effect transistor protection element.
Figure 3:
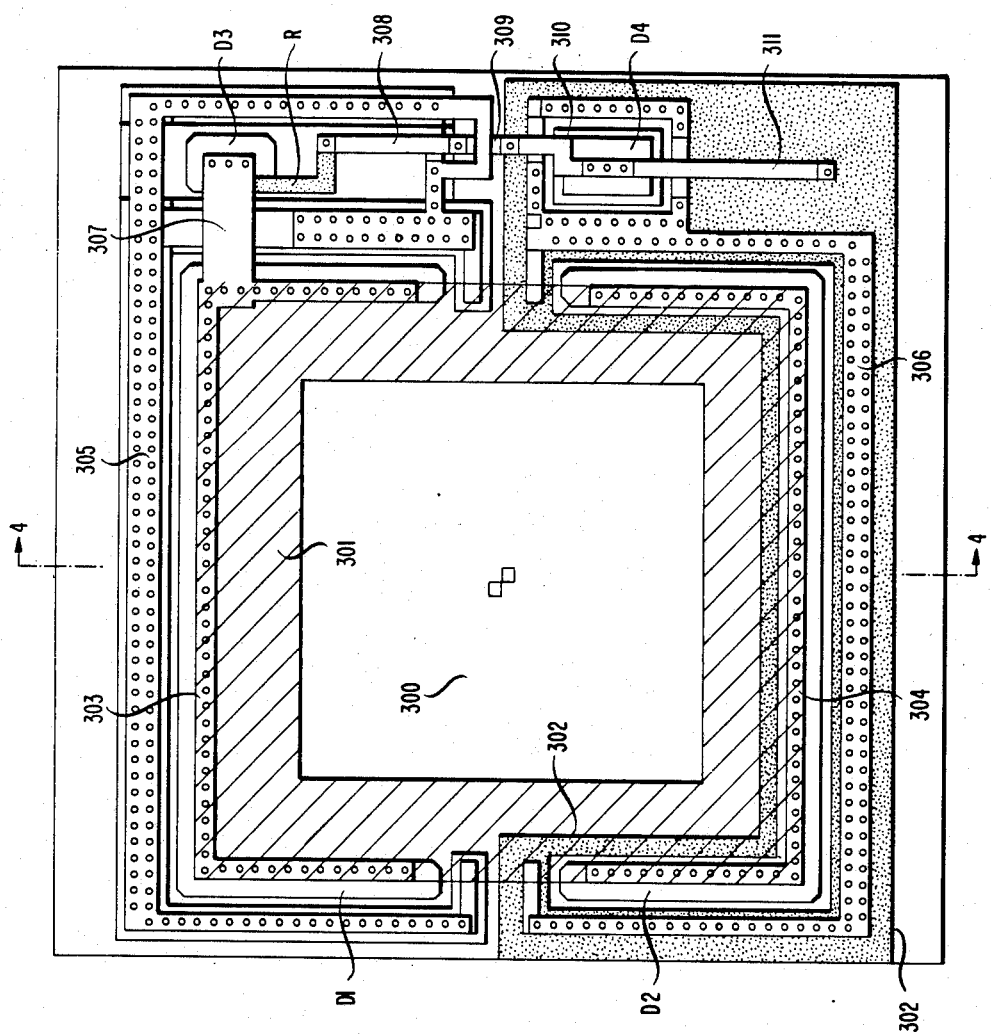
FIG. 3 illustrates a top view of an input pad protected according to the present technique.

Referring to FIG. 3, a top view of a bondpad protected by the present technique is shown. The invention is illustrated herein using silicon integrated circuit technology and in particular complementary metal oxide silicon (CMOS) technology. However, other complementary semiconductor integrated circuit types may utilize the present technique. A metal conductor pad comprises an outer portion 301 (shaded area as shown) that is covered with a "caps" insulator, and a central portion 300, the "caps opening", that is free of the insulator. The caps opening provides access to the pad for a subsequent wire bonding operation that electrically connects the pad to an external terminal of the integrated circuit chip or wafer. The conductor pad is underlaid by diode regions D1 and D2 along most of its periphery. The upper diode as viewed, D1, is formed in an n-type semiconductor region, whereas the lower diode D2 is formed in a p-type semiconductor region (302). The outline of the p-type region 302 is seen to form approximately a "U" shape along the lower portion of FIG. 3 as viewed. The semiconductor region external to region 302 is the n-type region. By placing the boundary between the p-type region and the n-type region outside of the caps opening portion 300, the possibility of p-n junction leakage due to stress imposed by the subsequent process of wire bonding to portion 300 is minimized. Also shown in FIG. 3 are contact windows arranged in two "U-shaped" groups 303 and 304 for connecting the contact pad to the two diodes along approximately the entire periphery of the conductor pad. A multiplicity of contact windows are shown for each diode. Alternately, a single long contact can be provided for each diode; the multiple contacts are presently preferred to aid in the lithographic process used to define the windows.

It can also be seen that the diodes D1 and D2 underlie almost the entire length of the periphery of the conductor pad. This technique allows for a number of advantages over prior art techniques. Firstly, space is conserved by the present technique, since the diodes both conform to the shape of the conductor pad and partially underlie it. Secondly, the current carrying capacity of the diodes is maximized, since the current from an ESD event is more evenly distributed along the length of a given diode than if it were contacted along only a small portion of its length. Note that the capacitance added by the diode to the input circuit is not substantially increased by the present technique, since that is determined mainly by the total area of the diode. Hence, the current carrying capability versus added capacitance of the diodes according to the present technique is increased as compared to prior art techniques. Thirdly, the present technique is compatible with CMOS processing for implementing the two diodes of opposite polarity (e.g., conductive for current flowing in opposite directions from the conductor pad). Also, the present technique minimizes conductor inductances between the contact pad and the diodes that can limit the response time of the protective circuit when an ESD event occurs.

Figure 4:
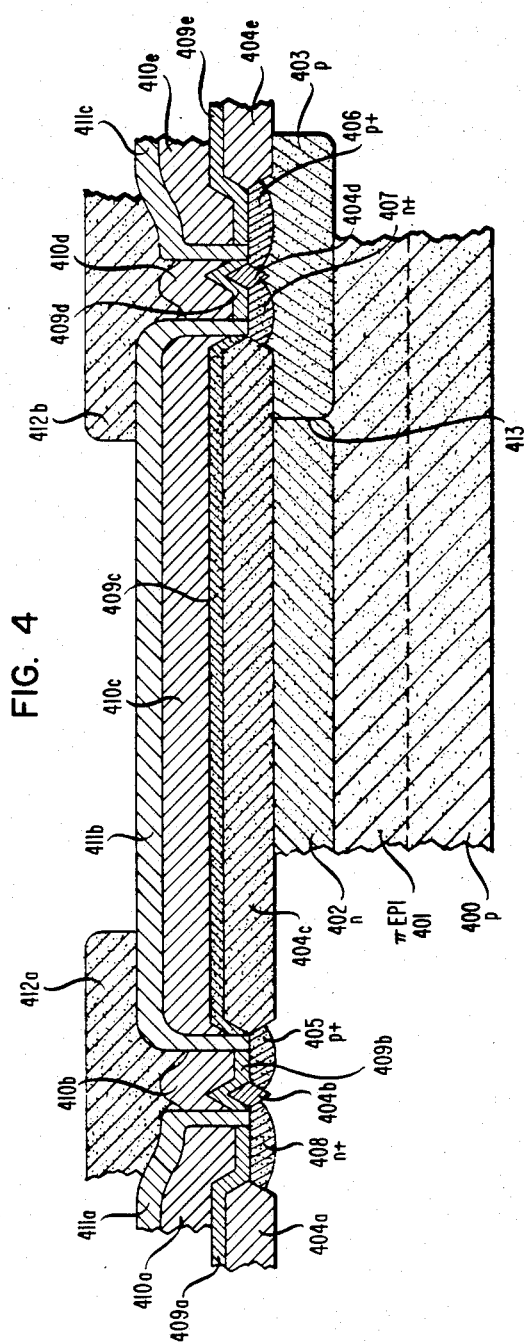
FIG. 4 illustrates a cross-sectional view of a semiconductor substrate and the input pad of FIG. 3.

Referring to FIG. 4, a cross-sectional view taken along line 4—4 of FIG. 3 is shown. A semiconductor body comprising a substrate 400 and an epitaxial layer 401 is shown. The substrate is of p conductivity type as shown, with a more lightly doped p-type epitaxial layer thereon. The epitaxial layer may be omitted in some designs, and the circuitry formed directly in the substrate. Furthermore, a n-type substrate and epitaxial layer may alternately be used. A n-type region (402), frequently referred to as a "well" or "tub" in the art, is shown formed in the semiconductor body. A p-type region (403) is also formed adjacent to the n-type region. One method of forming twin-tub regions is shown in U.S. Pat. No. 4,435,896, co-assigned with the present invention, with other techniques being possible. As noted above, the boundary 413 between these regions, which is a p-n junction, is optionally placed outside of the caps opening portion of the conductor pad. That is, the junction lies under the caps insulator 412 (a-b) that covers the outer portion (301) of the conductor pad. This placement reduces the possibility of leakage across junction 413 due to mechanical stress imposed by the subsequent wire bonding operation, as noted above.

In a typical process implementing the present invention, an insulating layer is formed at the surface of the semiconductor body. The insulating layer is lithographically patterned, and openings formed therein, thereby producing regions 404 (a-e). A p-type implant is used to form the top doped region 405 of diode D1, and also the guardring region 406 for diode D2. Similarly, a n-type implant is used to form the top doped region 407 of diode D2, and also the guardring region 408 for diode D1. A diffusion barrier layer 409, typically undoped $SiO_2$, is deposited thereon, followed by the deposition of a glass layer 410. The glass layer is of a relatively low melting point composition that typically includes phosphorus and boron. The contact windows for both the top contacts to diodes D1 and D2, as well as for the guardrings, are then lighographically defined and etched therethrough, producing regions 409 (a-e) and 410 (a-e). In one typical design, insulating layer 404 is thermally grown $SiO_2$ having a thickness of about 4500 angstroms. The doping of the p+substrate (400) is typically about $1.5 \times 10^{19}$ cm$^{-3}$, and of the epitaxial layer (401) about $5 \times 10^{14}$ cm$^{-3}$. The doping of p-tub 403 is about $1.7 \times 10^{16}$ cm$^{-3}$, and of n-tub 402 about $1.8 \times 10^{16}$ cm$^{-3}$. The p-type region 405 typically has a doping level of $5 \times 10^{19}$ cm$^{-3}$, while the doping level of n-type rgion 407 is about $2 \times 10^{20}$ cm$^{-3}$. The glass layer 410 has a thickness of about 9000 angstroms in the exemplary design, and the barrier layer 409 is about 250 angstroms thick. These values may vary widely according to principles known in the art from the exemplary values.

Following the etching of the windows, a conductor layer 411 is deposited, and lithographically defined and etched to produce regions 411 (a-c). Note that the edges of the layers 411 (a-c) extend down into the windows, thereby contacting the doped semiconductor regions at the surface of the semiconductor body. Although the sidewalls of the windows are shown vertical in FIG. 4, the glass layer (410) is typically heated to cause it to reflow and thereby smooth the slope of the sidewalls prior to the conductor (411) deposition. The conductor layer 411 typically is aluminum, and desirably includes a small amount of silicon to prevent spiking of the aluminum through the diode top regions. The central conductor region 411*b* forms the bondpad, and also contacts diodes D1 and D2 at top diode regions 405 and 407, respectively. The conductor 411a serves to connect the guardring region 408 to the positive power supply terminal. Similarly, the conductor 411c connects the guardring region 406 to the negative power supply terminal. Deposited on the conductor layer is a protective cap layer 412, typically silicon nitride or silicon dioxide. An opening is lithographically defined and etched in the cap, forming regions 412 (a-b), with the caps opening therebetween. The caps opening shown corresponds to the area 300 illustrated in FIG. 3. The protective cap then covers the region 301, and the other portions of the integrated circuit shown in FIG. 3 that are external to the caps opening.

Figure 5:
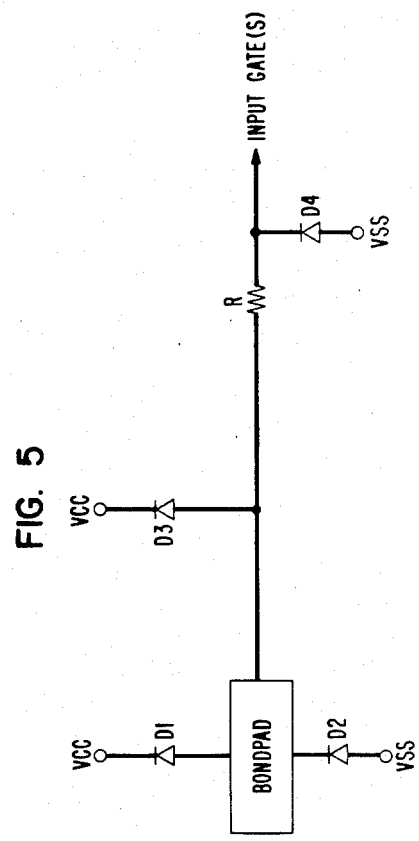
FIG. 5 illustrates schematically an input protection circuit implemented according to the present technique.

A conductor pad protected by the foregoing technique may be connected directly to the desired input circuitry of the integrated circuit. In many cases, additional ESD protection is desired, which may include an input resistor R and one or more additional diodes D3, D4; see FIG. 5. Resistor R typically has a resistance in the range of from 100 to 10,000 ohms, and about 1,800 ohms in one typical case. These additional devices may be implemented as shown in FIG. 3. A conductor 307, typically a portion of layer 411 (FIG. 4), connects the conductor pad to additional diode D3, which may be formed by the same implant operation as D1. A p-doped region in n-tub 402 serves as resistor R, and connects D3 to a conductor 308, typically also a portion of layer 411. Since conductor layer 411 also serves to contact the guardrings around D1-D4 as shown, a cross-under (309) of doped polysilicon connects metal region 308 to another metal region 310, which contacts diode D4. Diode D4 may be formed by the same implant operation as D2. Another metal region 311, also formed from layer 411, contacts the n-doped region of diode D4 through contact windows as shown, and continues therefrom to contact the input circuitry, thereby completing the coupling of the conductor pad and the input circuitry. Although diode D3 provides some additional ESD protection, its main function is to allow metal conductor 307 to contact doped resistor R without causing aluminum "spiking" from conductor 307 through the relatively narrow resistor region R to the n-tub region 402. Such spiking can be caused by an ESD event, and is reduced in probability by locating the contact window for conductor 307 in the center portion of a relatively larger p-doped region (i.e., D3) than provided for by the p-doped region of R. However, other connection schemes may make D3 unnecessary. Note also that resistor R itself forms a distributed diode along its length when formed as a p-doped region in n-tub 402. However, other resistor types are possible, including doped polysilicon types. While diode D4 also provides additional ESD protection, its use is relatively less important in most cases than the inclusion of R, and hence D4 is also optional.

While the bondpad is typically square as viewed from the top, other shapes are possible, including circles, rectangles, etc. The two protection diodes (D1, D2) have been illustratively shown to be of equal length along the periphery of the pad. However, unequal lengths are possible. For example, one diode may be shorter in length than the other to allow additional space for forming the conductor or resistor that couples the pad to the integrated circuit input circuitry. Typically, each diode underlies at least 25 percent of the total length of the periphery of the pad, and more typically at least 35 percent. Note that while input circuitry can be protected by the present technique, a given bondpad may serve as both an input and an output pad; the protection of an input-output pad is included herein.

What is claimed is:

1. An integrated circuit comprising a conductor pad coupled to input circuitry of said integrated circuit, and with said pad adapted to being connected to an external terminal,

CHARACTERIZED IN THAT said conductor pad contacts a p-type first region of a first diode along a first portion of the periphery of said pad, and contacts a n-type second region of a second diode along a second portion of the periphery of said pad, and wherein said first diode is formed in a n-type third region connected to a positive power supply means of said integrated circuit, and said second diode is formed in a p-type fourth region connected to a negative power supply means of said integrated circuit, wherein said conductor pad has an outer portion covered with an insulator and a central portion free of said insulator, with said central portion overlying a single one of the regions so that the semiconductor junction formed by the boundary between said third and fourth regions is not overlaid by said central portion.

2. The integrated circuit of claim 1 wherein said conductor pad is coupled to said input circuitry through a resistor having a resistance in the range of 100 ohms to 10,000 ohms.

3. The integrated circuit of claim 1 wherein said first portion and said second portion of the periphery of the conductor pad each comprise at least 25 percent of the total length of the periphery of said pad.

4. The integrated circuit of claim 1 wherein said first portion and said second portion of the periphery of the conductor pad each comprise at least 35 percent of the total length of the periphery of said pad.

5. The integrated circuit of claim 1 wherein said first portion of the periphery of said conductor pad is at least approximately equal in length to said second portion.

6. The integrated circuit of claim 1 wherein said first portion of the periphery of said conductor pad is unequal in length to said second portion.

7. The integrated circuit of claim 1 wherein said input circuitry comprises at least one insulated gate field effect transistor, with the gate thereof being coupled to said conductor pad.

8. The integrated circuit of claim 1 wherein said integrated circuit comprises complementary insulated gate field effect transistors.

9. The integrated circuit of claim 8 wherein said transistors are implemented in complementary metal oxide silicon technology.

10. An integrated circuit comprising a multi-sided conductor pad coupled to input or output circuitry of said integrated circuit, and with said pad adapted to being connected to an external terminal.

CHARACTERIZED IN THAT said conductor pad contacts a p-type region of a first diode along at least two sides of the periphery of said pad, and contacts a n-type region of a second diode along at least two sides of the periphery of said pad, and wherein said first diode is formed in a n-type region connected to a positive power supply means of said integrated circuit, and said second diode is formed in a p-type region connected to a negative power supply means of said integrated circuit, wherein the length of the periphery of the conductor pad contacted by the diodes is at least 50 percent of the total length of the periphery of said pad, and wherein each diode has at least one bend that conforms to at least one bend of the said multi-sided conductor pad.

11. The integrated circuit of claim 10 wherein the length of the periphery of the conductor pad contacted by the diodes is at least 70 percent of the total length of the periphery of said pad.

12. The integrated circuit of claim 10 wherein the length of the periphery of said conductor pad contacted by said first diode is at least approximately equal to the length of the periphery of said conductor contacted by said second diode.

13. The integrated circuit of claim 12 wherein said input circuitry comprises at least one insulated gate field effect transistor, with the gate thereof being coupled to said conductor pad.

14. The integrated circuit of claim 12 wherein said conductor pad is coupled to said input circuitry through a resistor having a resistance in the range of 100 ohms to 10,000 ohms.

15. The integrated circuit of claim 12 wherein said integrated circuit comprises complementary insulated gate field effect transistors.

16. The integrated circuit of claim 18 wherein said transistors are implemented in complementary metal oxide silicon technology.

* * * * *